(12) United States Patent
Yang et al.

(10) Patent No.: US 8,921,960 B2
(45) Date of Patent: Dec. 30, 2014

(54) MEMRISTOR CELL STRUCTURES FOR HIGH DENSITY ARRAYS

(75) Inventors: Jianhua Yang, Palo Alto, CA (US);
Minxian Max Zhang, Mountain View, CA (US); Gilberto Medeiros Ribeiro, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 101 days.

(21) Appl. No.: 13/560,935

(22) Filed: Jul. 27, 2012

(65) Prior Publication Data

US 2014/0027705 A1    Jan. 30, 2014

(51) Int. Cl.
*H01L 29/86* (2006.01)

(52) U.S. Cl.
USPC ......... 257/421; 257/E27.006; 438/3; 365/148

(58) Field of Classification Search
CPC ...... H01L 27/222; H01L 27/224; H01L 27/20
USPC ............... 257/5, E47.001, E21.004; 365/148; 438/382
See application file for complete search history.

(56) References Cited

U.S. PATENT DOCUMENTS

| | | | |
|---|---|---|---|
| 6,077,729 A | 6/2000 | Harshfield | |
| 7,791,059 B2 | 9/2010 | Jedema et al. | |
| 8,124,955 B2 | 2/2012 | Liu | |
| 8,569,731 B2 * | 10/2013 | Konno et al. | 257/4 |
| 2008/0128727 A1 * | 6/2008 | Erchak et al. | 257/98 |
| 2009/0134431 A1 * | 5/2009 | Tabata et al. | 257/210 |
| 2010/0078619 A1 | 4/2010 | Redaelli et al. | |
| 2011/0068313 A1 | 3/2011 | Liu | |
| 2011/0198554 A1 * | 8/2011 | Iijima et al. | 257/2 |
| 2011/0210304 A1 * | 9/2011 | Murooka et al. | 257/2 |
| 2012/0032132 A1 | 2/2012 | Lee et al. | |

* cited by examiner

*Primary Examiner* — Cheung Lee
*Assistant Examiner* — Stephen Bradley
(74) *Attorney, Agent, or Firm* — Van Cott, Bagley, Cornwall and McCarthy PC; Stevens L. Nichols (57) ABSTRACT

A memristor array includes a lower layer of crossbars, upper layer of crossbars intersecting the lower layer of crossbars, memristor cells interposed between intersecting crossbars, and pores separating adjacent memristor cells. A method forming a memristor array is also provided.

19 Claims, 4 Drawing Sheets

MEMRISTOR CELL STRUCTURES FOR HIGH DENSITY ARRAYS

BACKGROUND

The density of components in computational devices continues to increase while the cost per component continues to decrease. Moore's law is a rule of thumb in the history of computing hardware that states that the number of components that can be inexpensively placed on an integrated circuit doubles approximately every two years. The capabilities of many digital electronic devices are strongly linked to Moore's law: processing speed, memory capacity, sensors, and even the number and size of pixels in digital cameras. In the past, this doubling has been primarily performed by continuously shrinking the size of the complementary metal oxide semiconductor (CMOS) components. However, shrinking the size of CMOS components may reach a fundamental limit. For example, CMOS transistor pitches below 32 nanometers (the "16 nanometer node") may not be possible due to quantum tunneling, regardless of the materials used.

To continue to increase the density and decrease the cost of components in an integrated circuit, different technology can be used. Memristor technology can be used to create memory cells that have pitches significantly smaller than 32 nanometers.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

The small foot print of memristor cells is a significant advantage in scalability over other competing technologies. For example, individual memristor cells with sizes of 10 nanometers or less function well and can be repeatably manufactured. When memristors are assembled together in a memory array, one of the challenges is minimizing the thermal, chemical and electrical interference between adjoining cells. The principles below describe memristor cell structures that include pores between the cells. This minimizes the interaction between adjoining cells and allows for high density memristor arrays.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1:
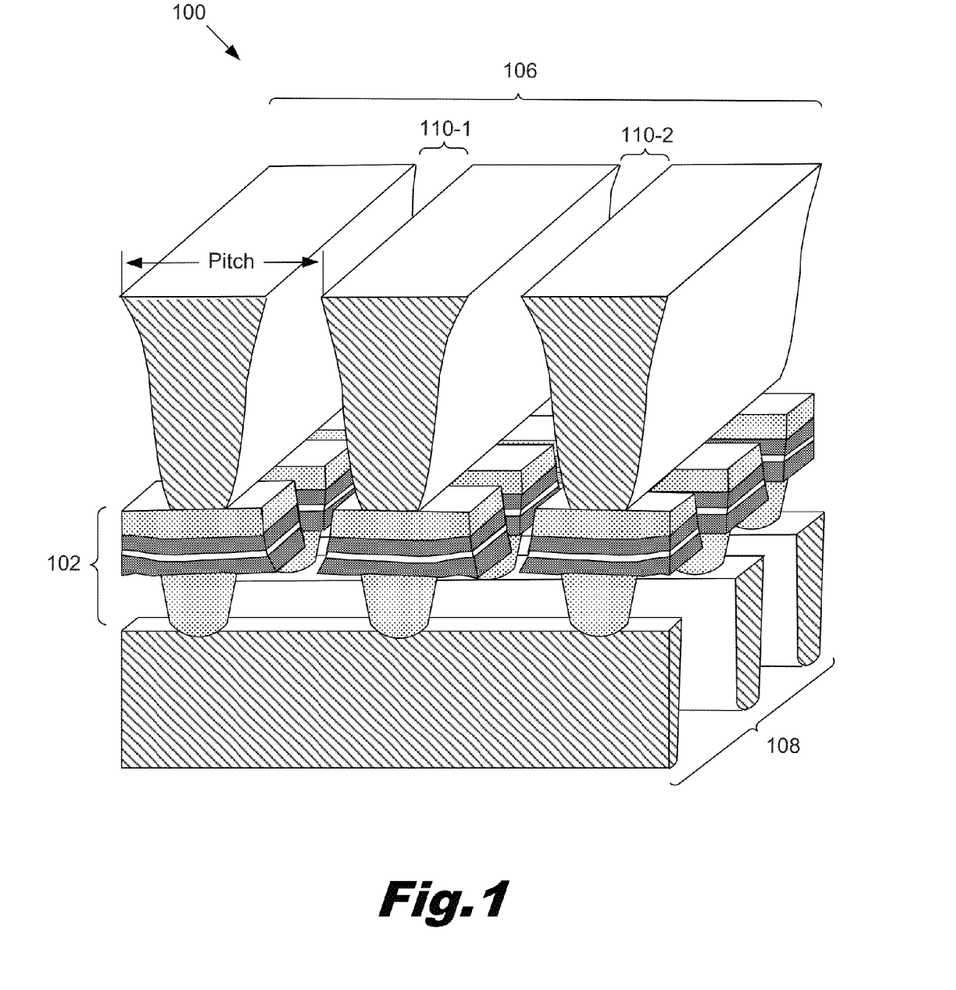
FIG. 1 is a greatly enlarged perspective view of a portion of a high density memory array, according to one example of principles described herein.

FIG. 1 is a greatly enlarged perspective view of a portion of a high density memory array. In this example, the memristor array includes a lower layer of crossbars (108) and an upper layer of crossbars (106). Memristor cells (102) are formed where the upper crossbars (106) and lower crossbars (108) intersect. In this example, the pitch between the crossbars may be on the order of 5 to 40 nanometers. This results in a memristor cell size of approximately 3-20 nanometers across. The spacing between the cells is also 3-20 nanometers. This very close spacing creates the potential for thermal and chemical interaction between cells. In the past, memory cells have been isolated by interposing a dielectric material between the cells. Ideally, the dielectric material creates a barrier between the cells that prevents migration of chemically active atoms and minimizes the transfer of thermal energy between cells. However, in the memristor array shown in FIG. 1, no dielectric material has been placed between the cells. In contrast, pores or voids (110-1, 110-2) have been created between the memristor cells. Using pores to isolate the cells may have a number of advantages, including eliminating chemical interaction between the dielectric and switching materials, minimizing electrical coupling between neighboring cells, and minimizing thermal interference between neighboring cells. Isolating the memristor cells using intercellular pores may also reduce the current needed to switch the cells and reduce the overall production cost of the memristor array.

Figure 2:
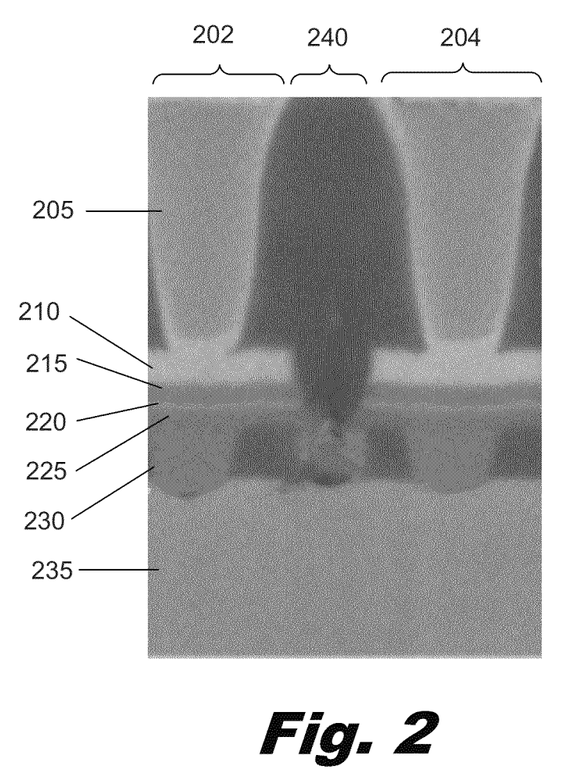
FIG. 2 is a scanning electron microscope image of a portion of a memristor array, according to one example of principles described herein.

FIG. 2 is a scanning electron microscope image of a portion of a memristor array. In this example, the lower crossbars (235) run left and right and are parallel to the plane of the page, and the upper crossbars (205) run in and out of the page. The cross section imaged by the scanning electron microscope is along the longitudinal axis of the lower crossbar (235) and across the width of the upper crossbars (205).

As discussed above, the memristor cells are formed at intersections between the upper crossbars (205) and lower crossbars (235). In this image only two memristor cells (202, 204) are shown. However, the memristor array includes a number of adjoining memristor cells. For example, a memristor array may include a million or more densely packed memristor cells. In one implementation, a memristor array may be a formed as a rectangular grid of memristors, with 1024 memristors along each side. The total number of memristors in the grid is $1024 \times 1024 = 2^{20}$ memristors. If each memristor is to store one bit of information, the memristor array has a total capacity of one mebibit. By placing a number of these arrays on a chip, memory densities of 4 to 10 terabits per centimeter square can be achieved.

The memristor cells may include a number of layers. In this example, the memristor cells include upper and lower barrier layers (210 and 230). The barrier layers (210, 230) form barriers between the crossbars and the switching layer (220). The barrier layers are specifically selected to prevent atoms contained within the crossbars from migrating into the switching layer (220) and altering its switching performance. For example, the barrier layers (210, 230) may be formed from tantalum nitride. In this example, the lower barrier (230) is formed as a column that extends upward from the lower crossbar and the upper barrier (210) was originally deposited as a continuous layer and became discrete segments under the intersection points after etching or lithography.

The memristor cell also includes an upper electrode (215) and a lower electrode (225). The upper and lower electrodes (215, 225) may be formed from a variety of materials, including titanium nitride. The upper and lower electrodes (215, 225) are designed to ensure that uniform electrical contact is made on both sides of the switching layer (220).

In this implementation, the switching layer (220) is in the center of the memristor cell and is sandwiched between the upper and lower electrodes. The switching layer (220) may be formed from a variety of materials or combination of these materials, including transition metal oxides. For example, the switching layer may be formed from titanium or tantalum oxides.

The switching layer (220) switches between a high resistance state and a low resistance state when a switching voltage is applied. The switching voltage may be used by applying a portion of the switching voltage (typically half the switching voltage) to a specific lower crossbar and a portion of the switching voltage to the upper crossbar. The memory cell that is interposed between the intersecting upper crossbar and lower crossbar sees the sum of the voltages applied. Electrical current flows through the selected memristor cell and changes its state from a high resistance state to a low resistance state or vice versa. In most implementations, the switching layer (220) has the highest electrical resistance of any layer in the memristor cell. Even when the switching layer (220) is in its low resistance state ("ON" state) the switching layer has an electrical resistance that is significantly higher than the electrical resistance of the barrier layers (210, 230) or the electrodes (215, 225).

The switching voltage/current produces a change in the electrical resistance of the switching layer. For example, if the switching layer is in an "ON" or low resistance state, a switching voltage could be applied to switch the switching layer to an "OFF" or high resistance state. If the switching layer is in the "OFF" state, a switching voltage could be applied to switch the switching layer to the "ON" state. The switching voltage causes a physical or chemical change in the structure of the switching layer that results in a desired change in the electrical resistance of the switching layer. For example, the switching voltage could cause migration of a mobile dopant species through the switching layer. The electrical resistance of the switching layer is dependent on the distribution of the mobile dopants. When the mobile dopants are distributed throughout the switching layer to create conductive paths through the switching layer, the switching layer is in a low resistance state. Conversely, when the position of the mobile dopants within the switching layer is concentrated to one side of the switching layer, the electrical conductivity through the switching layer significantly increases. The mobility of the mobile dopants significantly increases as the temperature of the switching layer increases and the distribution of the mobile dopants is influenced by voltage gradients. The applied switching voltage produces Joule heating in the switching layer and creates a voltage gradient that acts on the mobile dopants.

The state ("ON," "OFF," or some other intermediate state) of the switching layer is nonvolatile when a programming voltage is not present. For example, the switching layer may hold its programmed state for days or years. The nonvolatility of the switching layer is influenced by a number of factors, including the temperature of the switching layer. As discussed above, the mobility of the mobile dopants within the switching layer is strongly influenced by the temperature of the switching layer. One challenge in creating a highly dense memristor array is that when memory cells are programmed, the thermal energy leakage between two adjacent memory cells can cause an undesirable temperature rise in the switching layers of the adjacent memory cells. This rise in temperature increases the mobility of dopants in the switching layers. These dopants may then begin to migrate within the switching layers. Over time, this can create a change or loss of state in the memristors even though no programming voltage was applied targeting these memristors. To prevent this loss of state, it is desirable to minimize thermal leakage between memory cells. Thermal leakage between memory cells is determined by several factors, including the distance between the memory cells and the material between the memory cells. Increasing thermal isolation leads to more efficient heating of the switching layer. Consequently, lower amounts of current/voltage can be used for switching.

It is also desirable to chemically isolate the switching layers. Contamination of the switching layers can result in a severe degradation of their switching properties. For example, if a conductive contaminate species migrates into the switching layer, the switching layer may become permanently conductive. This renders the switching layer inoperative because it cannot be switched to an "OFF" or high resistance state. The switching layers are isolated vertically from the upper and lower barrier layers (205, 230). However, when a dielectric material is used to fill the space between cells (240), the dielectric material may become a path through which contaminates can travel. One of the standard solid dielectric materials is silicon oxide.

In one example, a solid dielectric is not used to fill the space between cells. This eliminates the path for contaminants and can reduce thermal leakage between cells. The space between cells can be filled with a gas, such as air, nitrogen, or a noble gas such as argon. In other examples, the space may be a vacuum or partial vacuum. Table 1 below shows a variety of gases that can be used to fill the space between memristor cells.

TABLE 1

| Material | Thermal Conductivity Watts per meter Kelvin | Electrical Resistivity Ohm meters | Dielectric constant |
|---|---|---|---|
| Air | .02 to 0.05 | $1 \times 10^{16}$ to $3 \times 10^{16}$ | 1.00059 |
| Nitrogen | .024 to .026 | | 1.00058 |
| Argon | .016 to .018 | | 1.000127 |
| Vacuum | 0 | Infinite | 1 |
| Silicon Oxide | 1 | $1 \times 10^{16}$ | 3.9 |
| PTFE | 0.25 | $10 \times 10^{22}$ to $10 \times 10^{24}$ | 2.0-2.1 |
| Expended PTFE | 0.24 | | 1.2-1.3 |

The values presented in this chart are only for illustration purposes. In practice, the values may have different magnitudes due to variations in environmental conditions, impurities, or other factors. In this example, silicon oxide has a thermal conductivity of 1 watt per meter Kelvin and an electrical resistivity on the order of $10^{16}$ ohm meters. In contrast, gases tend to have much lower thermal conductivity with a comparable electrical resistivity. For example the gasses listed have thermal conductivities on the order of 0.02 to 0.05 watts per meter Kelvin. Further, gases typically do not serve as a path for migration of electrically conductive atoms at the operating temperatures expected in a memristor array (less than 200 C). Consequently, filling the space between memristor cells with a gas can significantly increase the thermal and chemical isolation of the memristor cells. The gas can be placed in the cells in a variety of ways. For example, several of the manufacturing processes for creating the memristor cells can be performed in a high vacuum environment. Following manufacturing in the high vacuum environment, the chamber could be back filled with nitrogen, argon, or other desired gas. This gas would fill the spaces between the cells. A covering layer could then be deposited over the spaces to seal the gas into the memristor array. The gas may leak from the memristor array or be contaminated by other gases. This may slightly lower the performance of the gas. However as seen above, the electrical resistance and thermal conductivity values for atmospheric air are not that much different from nitrogen and argon. Thus diffusion of air into the spaces may not cause significant degradation.

If it is desirable to fill the spaces in the memristor array with air, no particular action is required. The spaces will automatically fill with air as the memristor array during the manufacturing processes that are performed in an ambient environment. In some examples, the humidity may be controlled to ensure that excess water vapor does not accumulate in the spaces between the memristor cells.

Expanded PTFE is a solid porous insulator with very low dielectric constant (1.2 vs. 1 for vacuum). An example of expanded PTFE is GORE TEX®. The use of a solid insulator, such as PTFE, rather than gaseous insulator can be advantageous to protect devices under mechanical or thermal stresses. Further, the solid insulator can provide additional dimensional stability to the memristor array.

Figure 3:
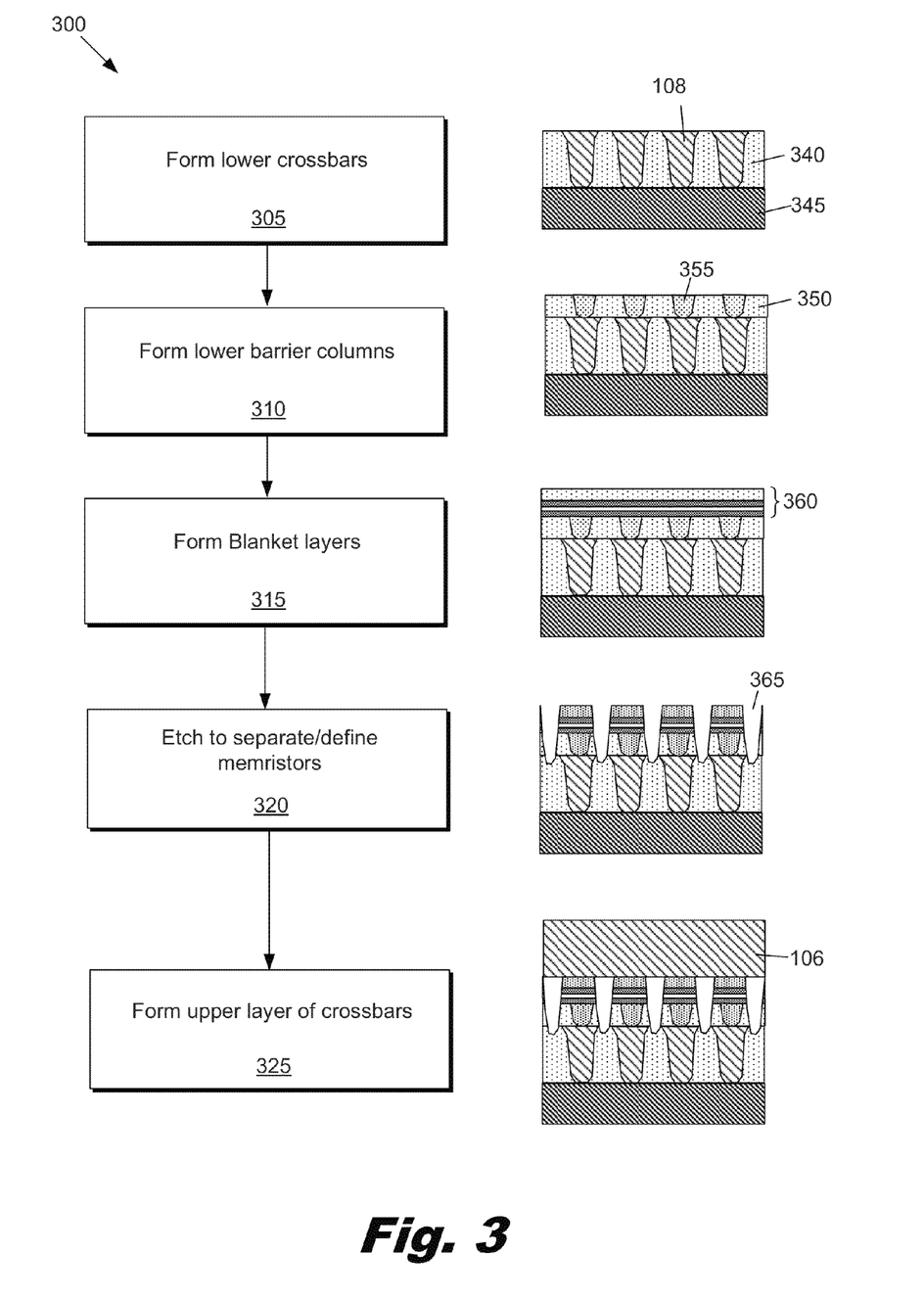
FIG. 3 is a flowchart with accompanying diagrams of a method for constructing memristor cell structures in high density arrays, according to one example of principles described herein.

FIG. 3 is a method (300) for constructing memristor cell structures for high density arrays. The lower crossbars (108) are formed on a substrate (345) (block 305). In the illustration to the right of the flow chart, the lower crossbars (108) extend into and out of the page. The cross sections of four parallel lower crossbars are shown.

The lower crossbars can be formed from a range of materials using a variety of techniques. In one example, the lower crossbars are copper and are formed using a damascene technique as described below. Copper damascene has a number of advantages over traces formed by traditional aluminum subtractive etching. The damascene process has the advantage of forming very narrow and deep features. This can be a significant advantage in creating high density devices. For example, conductors formed using damascene techniques can be tall and narrow. The height of the conductor allows the cross section of the conductors to remain large enough to maintain a desired level of electrical conductivity, while the narrowness of the conductors allows them to be packed very closely together to produce a high planar density on the substrate surface.

Additionally, copper has an electrical resistivity that is much smaller than aluminum. The smaller resistivity translates into smaller line resistances, which in turn translates into smaller Resistance Capacitance (RC) delay. Smaller RC delay means the speed performance of the devices increases. Secondly as, resistivity decreases, joule heating also decreases. This means that for the same amount of joule heating, large current densities can be present. Larger values of current density mean that devices can have smaller areas and be scaled down even more. Thirdly copper has larger activation energy than aluminum. Electromigration, a significant reliability issue, is largely dependent on the activation energy of the metal. Electromigration mean-time-to-failure (MTF) is directly proportional to the exponent of activation energy, EA of the metal. Since copper has higher activation energy than aluminum, it is more resistant to electromigration failures.

Producing the desired features using copper damascene techniques is an additive process. In one example, the dielectric is deposited, and then dielectric is etched according to the defined photoresist pattern. Next, a barrier layer is deposited to prevent junction spiking. After that a thin seed layer of copper is deposited conformally over the surface. The seed layer allows the copper to be electrochemically deposited. After depositing the seed layer, the structure is electroplated with copper. The excess copper is removed by planarization.

To form the lower crossbars using the copper damascene process, a photoresist layer (340) is deposited and photo lithography is used to create a number of deep trenches in the photoresist layer. Copper is then deposited into the trenches to form the lower crossbars (108). For example, the copper may be deposited using vacuum deposition, chemical deposition or mechanical deposition techniques. Excess copper may be removed using a variety of techniques including chemical-mechanical planarization (CMP). CMP is a process of smoothing wafer surfaces with the combination of chemical and mechanical forces. The main reason for using a hybrid of chemical etching and free abrasive polishing is because mechanical grinding alone causes too much damage to the wafer surface, while chemical etching alone does not promote good planarization of surface. This process can be is generally used to remove silicon oxide, poly silicon, and metal surfaces and to provide plane surfaces. The advantages of CMP are good selectivity, reduction of resist thickness variation, increased resolution of photolithographic process, improved step coverage of subsequent layer deposition, and multi-level interconnection. CMP encourages no lapping, which means that it will only polish the selected material and stop polishing at non-selective layer, whereas different planarization techniques may remove different materials at the same rate.

The photoresist material (340) may or may not be removed after formation of the lower crossbars (108). The upper barrier columns (335) are formed (block 310) in a similar manner. For example, a second layer of photo resist may be deposited over the lower crossbars. Photolithography or another suitable technique is used to form holes through the second layer of photo resist and expose portions of the lower crossbars. Conductive material is then placed into the holes to form the lower barrier columns. The lower barrier columns are in electrical and physical contact with the lower crossbars.

After the lower crossbars (108) and barrier columns (310) have been formed, a number of blanket layers are deposited over the columns (310) (block 315). In this example, the blanket layers include a lower electrode, a switching layer, an upper electrode, and an upper barrier layer. These layers are shown in the cross sectional image of FIG. 2. The blanket layers are generally smooth and continuous across the entire surface of the electrode array. The layers may be created using a variety of deposition techniques including physical vapor deposition, chemical vapor deposition, physical vapor deposition, sputtering, molecular beam epitaxy, atomic layer deposition, and ion implantation.

Following the deposition of the blanket layers, the individual memristor cells are formed by creating cavities (365) through the blanket layers (block 320). The cavities may or may not extend through the photoresist layers beneath the blanket layers. The cavities may be formed in a variety of ways, including dry etching, wet etching, selective etching, anisotropic etching, or isotropic etching. For example, the cavities may be formed using a reactive ion etch. The cavities break the blanket layers apart into islands, with each island forming a memristor.

The upper layer of crossbars is then formed (block 325). The upper crossbars are in electrical and mechanical contact with the upper most blanket layer. Using this technique, the memristor cells are separated by the cavities that were created at the crossbar intersections. These cavities (365) may or may not be closed and may be filled with any number of materials, including gases or porous insulating materials.

Figure 4A:
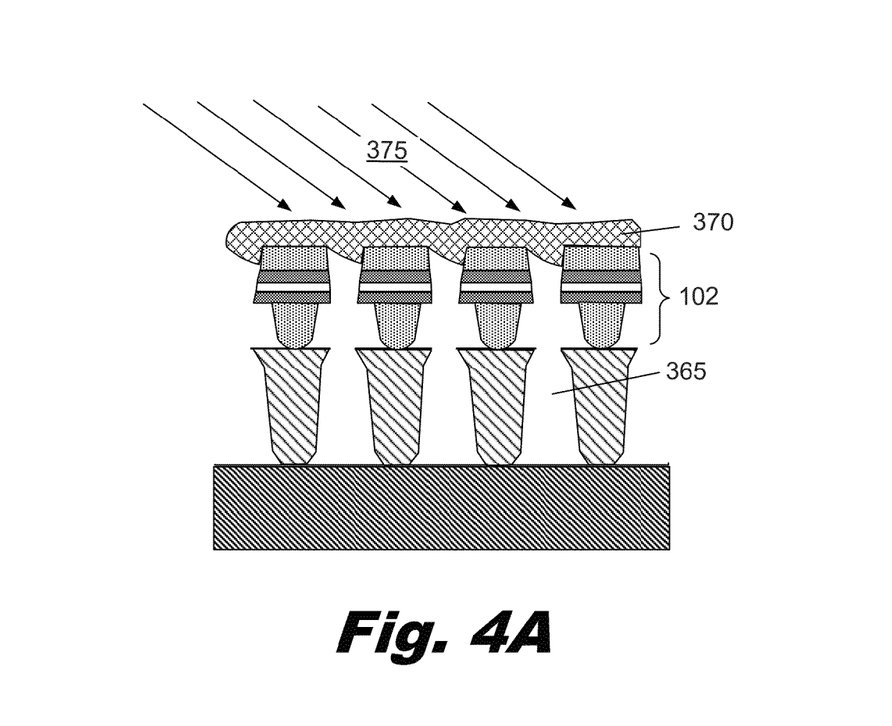
FIGS. 4A and 4B show a number of alternative approaches for forming pores between memristor cells, according to one example of principles described herein.
Figure 4B:
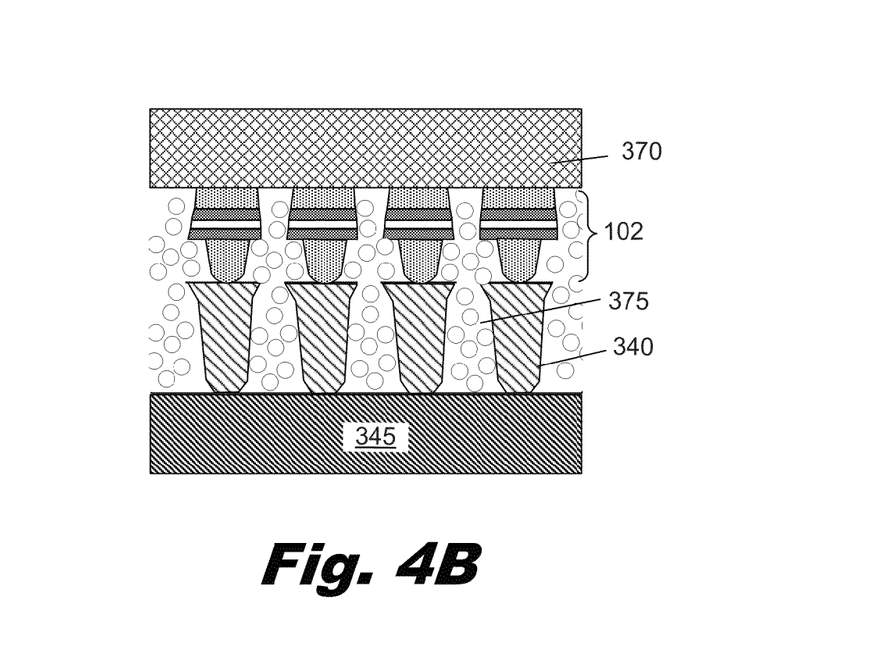

FIGS. 4A and 4B show a number of alternative approaches for forming pores between memristor cells (102). There may or may not be dielectric material between the copper bottom conductors made by copper damascene. However, in each example there is only vacuum/gas/porous material between the switching material cells (102) in FIG. 4A. FIG. 4A is a cross sectional diagram that shows an angled deposition technique being used to form pores between adjacent memory cells (102) after cavities (365) have been etched between the cells. Angled deposition involves directional deposition of material using a collimated evaporation beam that has a large incident angle with respect to the substrate (345) normal. The individual memristor cells (102) act as barriers that shadow the pores between the memristors cells. Consequently, the majority of the material will be deposited on the top of the memristor cells and far less will be deposited in the pores between the cells. Ideally, the deposited material would not extend into the pores far enough to contact the switching layer. In contrast, vertical or non directional deposition of material over the memory cells could fill the cavities and create undesirable electrical, thermal and chemical pathways between the cells.

As discussed above, the switching layer generates the most heat during operation and is the most sensitive to contamination. Consequently, it is desirable for the deposited material not to contact the switching layer. The deposited material (370) forms a "cap" over the top of the voids (365) and memristor cells (102). The deposited material (370) can then be patterned during creation of the upper crossbar cells. For example, the deposited material can be patterned so that the upper surface of the memristor cell is exposed. The deposited material may be patterned to receive the conductive material that will form the upper crossbars, or an additional mask layer may be formed over the deposited material. After formation of the upper crossbars, the deposited material may or may not be removed. If the deposited material is not removed, it can act to retain any gas or other material that is present in the pores between the memristor cells.

FIG. 4B shows a cross sectional diagram of a high density memristor array that includes a porous material (375) interposed between memristor cells. For example, the space between the memristor cells may be filled with polytetrafluoroethylene (PTFE). PTFE can be formed in a number of ways, including as a thin film, as a solid block, and as a mechanically expanded solid. PTFE is used in high performance fabrics, medical implants, filter media, electrical insulation and a variety of other products. PTFE has a number of desirable characteristics, including a high electrical resistance, a low thermal conductivity and chemical inertness. As shown in the graph above, PTFE has an electrical resistance of $10^{22}$ to $10^{24}$ Ohms meters and thermal conductivity of 0.25 Watts per meter Kelvin. The PTFE may or may not be in between the copper conductors (340, FIG. 4B).

PTFE is widely reported as having excellent chemical stability at temperatures as high as 340 C. This temperature is significantly higher than the operational temperature of the memristor array. In some examples, filaments of the PTFE are formed in the spaces between the memristors. Additionally or alternatively, porous PTFE, with a structure similar to mechanically expanded PFTE could be formed in the spaces between the memristors. For example, PTFE could be sputtered into the memristor array. The characteristics of the sputtering process can be adjusted to produce the desired carbon-fluorine structures and composition.

The advantages of creating high density memristor arrays that include pores between the memristor cells includes minimizing chemical interaction between the memristors cells, low electrical coupling between neighboring cells, and the least thermal interference between cells. Increased thermal isolation of the memristor cells results in lower amounts of current needed for switching. This in turn reduces the overall power consumption and heat generated by the memory array. This increased efficiency can result in a longer battery life or reduced battery size/mass for mobile applications.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A memristor array comprising:
a lower layer of crossbars;
an upper layer of crossbars intersecting the lower layer of crossbars;
memristor cells interposed between intersecting crossbars, each memristor cell comprising a mobile dopant movable by a switching voltage to change an electrical resistance of that memristor cell;
pores separating adjacent memristor cells; and
a capping layer covering said pores that varies in thickness, being thicker on one side of a memristor cell than an opposite side of that memristor.

2. The array of claim 1, in which memristor cells comprise a switching layer, in which pores electrically, thermally and chemically separate the switching layer from adjacent switching layers.

3. The array of claim 1, in which the pores comprise an enclosed space between memristor cells.

4. The array of claim 3, in which the enclosed space comprises at least a partial vacuum.

5. The array of claim 3, in which the enclosed space is substantially filled with gas.

6. The array of claim 5, in which the gas comprises one of: nitrogen, atmospheric air, and a noble gas.

7. The array of claim 1 in which the capping layer that varies in thickness, being thicker on one side of a memristor cell than an opposite side of that memristor cell, is as a result of being deposited by angled deposition, in which the capping layer does not extend to a switching layer in the memristor cells.

8. The array of claim 1, in which the pores have a thermal conductivity of 0.5 watts per meter Kelvin.

9. The array of claim 1, in which the pores have an electrical resistivity greater than silicon oxide.

10. The array of claim 1, in which the pores comprise a porous material.

11. The array of claim 1, in which the pores comprise a carbon fluorine compound interposed between the memristor cells.

12. The array of claim 1, in which the memristor cells comprise segments of blanket layers, in which the memristor cells and pores are formed by selective removal of the portions of the blanket layers.

13. The array of claim 1, in which the distance between adjacent memristor cells is less than 10 nanometers, the memristor cell has a planar width of less than 10 nanometers and the pitch of the upper crossbars is less than 20 nanometers.

14. The array of claim 1, wherein the pores contain a polytetrafluoroethylene (PTFE) gas.

15. A memristor array comprising
a lower layer of crossbars;

an upper layer of crossbars intersecting the lower layer of crossbars;

memristor cells interposed between intersecting crossbars, each memristor cell comprising a mobile dopant movable by a switching voltage to change an electrical resistance of that memristor cell; and pores thermally, electrically and chemically separating adjacent memristor cells, the pores comprising an enclosed space between memristor cells filled with a gas;

wherein a capping layer covering said pores varies in thickness, being thicker on one side of a memristor cell than an opposite side of that memristor cell as a result of angled deposition.

16. The array of claim 15, wherein:

the pores have a thermal conductivity of less than 0.5 watts per meter Kelvin; and the distance between adjacent memristor cells is less than 20 nanometers, the memristor cell has a planar width of less than 20 nanometers and the pitch of the upper crossbars are less than 40 nanometers 17. A method for creating a memristor array, the method comprising:

forming a lower layer of crossbars;

forming lower barrier structures on crossbars in the lower crossbar layer;

forming blanket layers over the lower barrier structures;

removing portions of the blanket layers around the lower barrier structures to form memristor cells, each of the memristor cells comprising a lower barrier structure and blanket material immediately over the lower barrier structure, in which removing portions of the blanket layers forms pores that surround the memristor cell, in which the pores are a permanent features of the array;

forming an upper layer of crossbars over the memristor cells such that each memristor cell is interposed between an intersecting crossbar array; and forming a capping layer for capping said pores by angled deposition such that said capping layer varies in thickness, being thicker on one side of a memristor cell than an opposite side of that memristor cell.

18. The method of claim 17, wherein forming the lower layer of crossbars comprises forming the lower layer of crossbars with a copper damascene technique.

19. The method of claim 17, further comprising discontinuing said angled deposition before a thickness of the capping layer contacts a switching layer of a memristor cell.

* * * * *

UNITED STATES PATENT AND TRADEMARK OFFICE
CERTIFICATE OF CORRECTION

| | | |
|---|---|---|
| PATENT NO. | : 8,921,960 B2 | Page 1 of 1 |
| APPLICATION NO. | : 13/560935 | |
| DATED | : December 30, 2014 | |
| INVENTOR(S) | : Jianhua Yang et al. | |

It is certified that error appears in the above-identified patent and that said Letters Patent is hereby corrected as shown below:

Title page, (74), Attorney, in column 2, line 2, delete "Stevens L. Nichols" and insert
-- Steven L. Nichols --, therefor.

Signed and Sealed this
Thirtieth Day of June, 2015

Michelle K. Lee
*Director of the United States Patent and Trademark Office*